(12) United States Patent
Sheikh et al.

(10) Patent No.: US 9,935,615 B2
(45) Date of Patent: Apr. 3, 2018

(54) RLS-DCD ADAPTATION HARDWARE ACCELERATOR FOR INTERFERENCE CANCELLATION IN FULL-DUPLEX WIRELESS SYSTEMS

(71) Applicant: Intel Corporation, Santa Clara, CA (US)

(72) Inventors: Farhana Sheikh, Hillsboro, OR (US); Ching-En Lee, Hillsboro, OR (US); Feng Xue, Redwood City, CA (US); Anuja S. Vaidya, Portland, OR (US); Eduardo X. Alban, Hillsboro, OR (US); Albert Oskar Filip Andersson, Portland, OR (US); Chia-Hsiang Chen, Sunnyvale, CA (US); Shu-Ping Yeh, New Taipei (TW)

(73) Assignee: Intel Corporation, Santa Clara, CA (US)

(*) Notice: Subject to any disclaimer, the term of this patent is extended or adjusted under 35 U.S.C. 154(b) by 192 days.

(21) Appl. No.: 14/861,421

(22) Filed: Sep. 22, 2015

(65) Prior Publication Data
US 2017/0085252 A1    Mar. 23, 2017

(51) Int. Cl.
*G06F 17/10* (2006.01)
*H03H 21/00* (2006.01)
(Continued)

(52) U.S. Cl.
CPC ........ *H03H 21/0012* (2013.01); *G06F 9/3877* (2013.01); *G06F 17/16* (2013.01);
(Continued)

(58) Field of Classification Search
CPC ....... H03H 21/0012; H03H 2021/0049; H03H 2021/0094; H03H 2218/06; G06F 9/3877; G06F 17/16; H04B 1/525
(Continued)

(56) References Cited

U.S. PATENT DOCUMENTS

| 4,558,462 A * | 12/1985 | Horiba ............... G06T 5/006 382/275 |
| 6,952,460 B1 * | 10/2005 | Van Wechel ........ G01S 1/024 342/357.59 |

(Continued)

OTHER PUBLICATIONS

Liu, Jie. "DCD Algorithm: Architectures, FPGA Implementations and Applications." Communications Research Group, Department of Electronics, University of York. Nov. 2008. 159 pages.
(Continued)

*Primary Examiner* — Michael D. Yaary
(74) *Attorney, Agent, or Firm* — Eschweiler & Potashnik, LLC

(57) ABSTRACT

An adaptation hardware accelerator comprises a calculation unit to receive inputs at predefined time interval(s) that correspond to a calculation iteration, the inputs associated with adaptive filters having taps, and determine correlation and cross-correlation data based thereon for a given iteration. The correlation data comprises a correlation matrix. Determining the matrix comprises determining submatrices in an upper triangular portion and a diagonal portion of the matrix. The accelerator comprises an adaptation core unit to determine adaptive weights associated with the adaptive filters, respectively, based on an adaptive algorithm, utilizing the correlation and cross correlation data. The accelerator unit comprises a convergence detector unit to determine a convergence parameter; and a controller to generate an iteration signal for each time interval based on the parameter. The iteration signal communicates to continue or conclude; the conclusion indicates determination of a final value of adaptive weights by the core unit.

23 Claims, 11 Drawing Sheets

(51) Int. Cl.
*G06F 17/16* (2006.01)
*G06F 9/38* (2018.01)
*H04B 1/525* (2015.01)

(52) U.S. Cl.
CPC .............. *H03H 2021/0049* (2013.01); *H03H 2021/0094* (2013.01); *H03H 2218/06* (2013.01); *H04B 1/525* (2013.01)

(58) Field of Classification Search
USPC ......................................................... 708/300
See application file for complete search history.

(56) References Cited

U.S. PATENT DOCUMENTS

| | | | | |
|---|---|---|---|---|
| 7,953,579 | B2* | 5/2011 | Hollis | G06G 7/26 327/552 |
| 2003/0031242 | A1* | 2/2003 | Awad | H03H 21/0012 375/232 |
| 2006/0277236 | A1* | 12/2006 | Pisek | G06F 17/15 708/231 |
| 2007/0184782 | A1 | 8/2007 | Sahota et al. | |
| 2011/0090973 | A1* | 4/2011 | Mishra | H04L 5/0025 375/260 |
| 2011/0143700 | A1* | 6/2011 | Lagunas Hernandez | G01S 7/021 455/226.1 |

OTHER PUBLICATIONS

"Adaptive filter." Wikipedia, printed Sep. 22, 2015. 8 pages.
Douglas, Scott C. "Introduction to Adaptive Filters." CRC Press LLC, 1999. 20 pages.
"Adaptive Interference Canceling." printed Sep. 22, 2015. 3 pages.
"Overview of Adaptive Filters and Applications." Matlab & Simulink, printed Sep. 22, 2015. 4 pages.
Liu, Jie et al, "FPGA implementation of RLS adaptive filter using dichotomous coordinate descent iterations." IEEE International Conference. Jun. 14, 2009. 5 pages.
Arablouei, Reza et al, Recursive Total Least-Squares Algorithm Based on Inverse Power Method and Dichotomous Coordinate-Descent Iterations, IEEE Transactions on Signal Processing, vol. 63, No. 8, Apr. 15, 2015. pp. 1941-1949.
Extended European Search Report, EP Application No. 16184520. 1-1874. Dated Jan. 23, 2017.

* cited by examiner

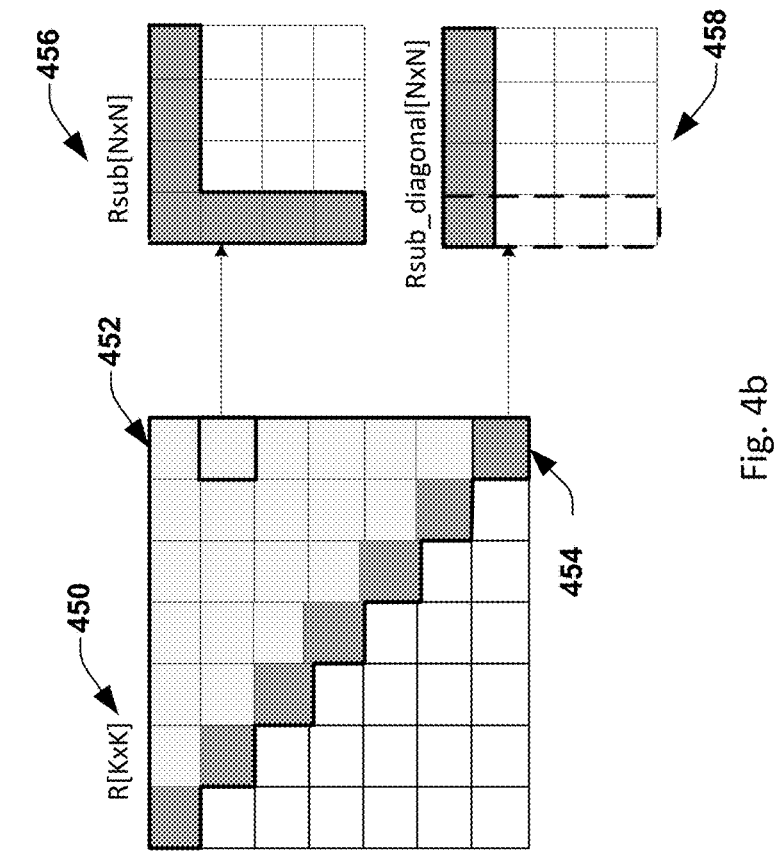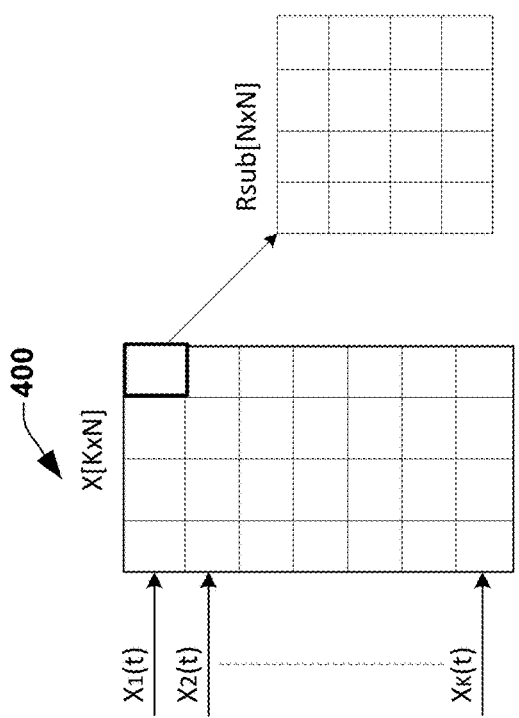
Fig. 4b
Fig. 4a

RLS-DCD ADAPTATION HARDWARE ACCELERATOR FOR INTERFERENCE CANCELLATION IN FULL-DUPLEX WIRELESS SYSTEMS

FIELD

The present disclosure relates to full duplex wireless systems and, in particular to an apparatus and a method for interference mitigation in full duplex wireless systems.

BACKGROUND

Interference cancellation is a key enabler of full-duplex radio communication. One particular type of interference is known as 'self-interference' which refers to interference from the transmit signal on to the receive path in the transceiver. The transmit power is high compared to the receive power, hence transmit signals at high power can dominate received signals in full-duplex radio communications. Self-interference cancellation enables lower cost components in the transceiver by relaxing the requirements on other cancellation components in full-duplex systems, thereby saving billions of dollars in mass produced transceivers for full-duplex radios. Self-interference cancellation techniques that are implemented in the digital domain can potentially cancel 20-25 dB or more of interference (originating from the transmit path) in the receive path.

An adaptive filter is a filter that self-adjusts the filter coefficients/weights according to a recursive algorithm, which enables the filter to perform satisfactorily in an environment where the statistics of the input signals are not available or are time-varying. An adaptive filter in the receive path of a full-duplex communication system cancels nonlinear interference arising from nonlinear components in the transmitter implementation. Recursive Least Squares (RLS) based algorithms attract a lot of interest in adaptive filtering applications due to its fast convergence speed. Recursive Least Squares (RLS) based algorithms recursively find filter coefficients that minimize the weighted linear least squares cost function relating to the input signals. However, the RLS algorithm offers extremely fast convergence at a cost of large area and power in its hardware implementation.

BRIEF DESCRIPTION OF THE DRAWINGS

Some examples of circuits, apparatuses and/or methods will be described in the following by way of example only. In this context, reference will be made to the accompanying Figures.

FIG. 4a shows an input matrix X[K×N] 400 for a generalized K-filter N-tap system, according to one embodiment of the disclosure.

FIG. 4b shows a correlation matrix R[K×K] 450 for the generalized K-filter N-tap system, according to one embodiment of the disclosure.

DETAILED DESCRIPTION

Figure 1:
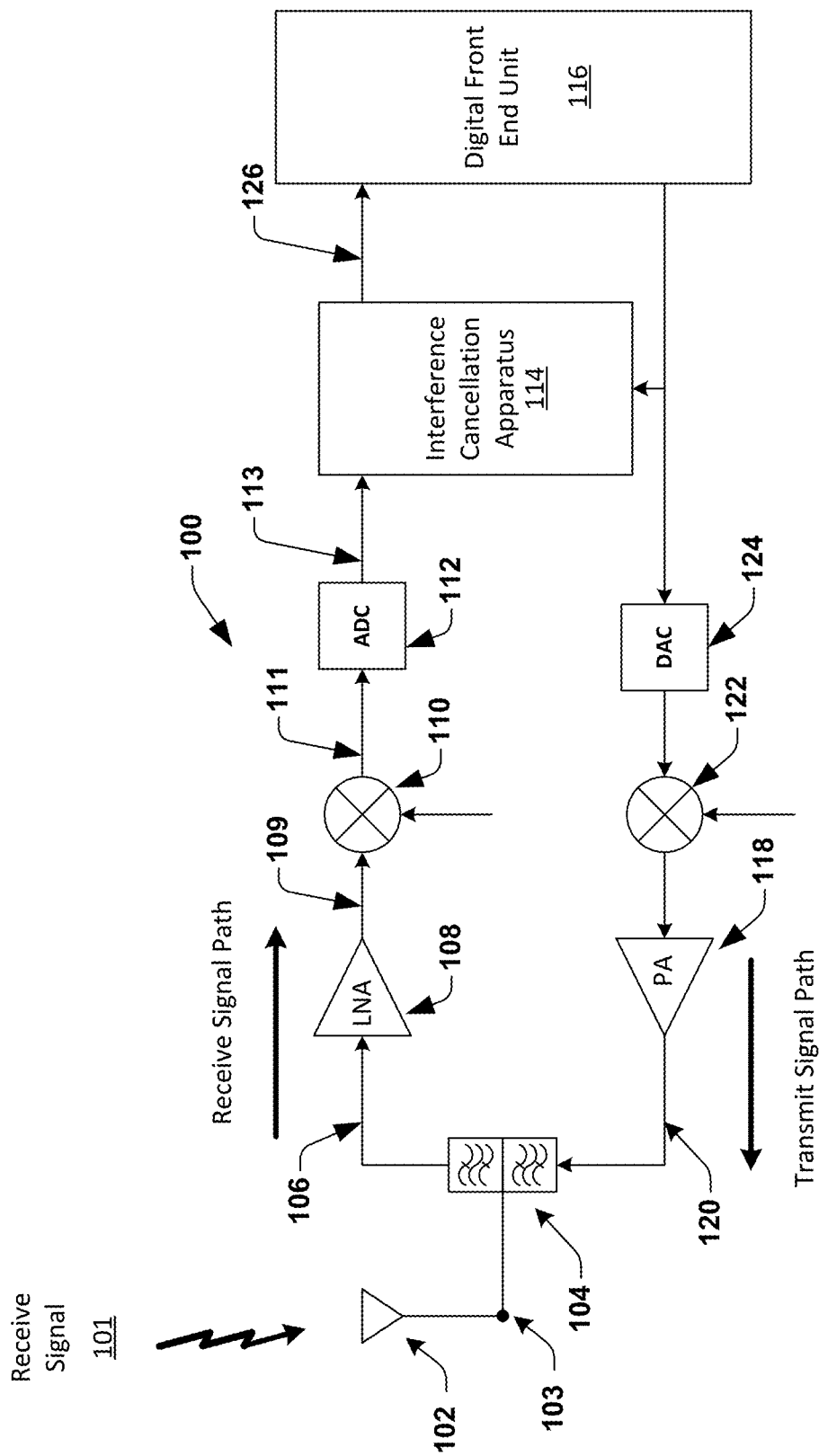
FIG. 1 shows a simplified block diagram of a full-duplex wireless system 100 having an interference cancellation apparatus, according to one embodiment of the disclosure.

In one embodiment of the disclosure, an adaptation hardware accelerator comprises a calculation unit configured to receive a plurality of inputs at one or more predefined time intervals, wherein each time interval corresponds to a calculation iteration, the plurality of inputs being associated with a plurality of adaptive filters each having a plurality of taps, and determine a correlation data and a cross-correlation data based thereon for a given calculation iteration. The correlation data comprises a correlation matrix comprising a plurality of sub-matrices, wherein determining the correlation matrix comprises determining only the submatrices in an upper triangular portion and a diagonal portion of the correlation matrix. Further, the adaptation hardware accelerator comprises an adaptation core unit configured to determine a plurality of adaptive weights associated with the plurality of adaptive filters, respectively, in the given calculation iteration based on an optimized adaptive recursive least squares (RLS) based algorithm by utilizing the correlation data and the cross correlation data. In addition, the adaptation hardware accelerator comprises a convergence detector unit configured to determine a convergence parameter and a controller configured to generate an iteration signal for each of the predefined time intervals based on the convergence parameter, wherein the iteration signal communicates to the correlation unit and the adaptation core unit to continue with a next calculation iteration or to conclude, wherein the conclusion indicates a determination of a final value of the plurality of the adaptive weights by the adaptation core unit.

In one embodiment of the disclosure, an adaptation hardware accelerator comprises a calculation unit configured to receive a plurality of inputs at one or more predefined time intervals, wherein each time interval corresponds to a calculation iteration, the plurality of inputs being associated with a plurality of adaptive filters each having a plurality of taps. The calculation unit is configured to determine a correlation data and the cross-correlation data based thereon for a given calculation iteration. Further, the adaptation hardware accelerator comprises a dichotomous coordinated descent (DCD) core unit configured to determine a plurality of adaptive weights associated with the plurality of adaptive filters, respectively, based on the correlation data and the cross correlation data. The architecture for the adaptation hardware accelerator can support alternate RLS algorithms other than DCD. In an example embodiment, the DCD core unit determines the plurality of adaptive weights by defining a residual vector comprising the correlation data and determining the plurality of adaptive weights based on the defined residual vector. In addition, the adaptation hardware accelerator comprises a convergence detector unit configured to determine a convergence parameter; and an example embodiment of a controller configured to generate an iteration signal for each of the predefined time intervals based on the convergence parameter. The iteration signal communicates to the calculation unit and the DCD core unit to continue with a next iteration or to conclude, wherein the conclusion indicates a determination of a final value of the plurality of the adaptive weights by the DCD core unit. In one embodiment, the defined residual vector is updated in the next iteration together with a determination of the cross correlation data only when the iteration signal indicates the next iteration.

In another embodiment of the disclosure, a method for reducing self-interference using a hardware accelerator comprises receiving a plurality of inputs at one or more predefined time intervals, wherein each time interval corresponds to a calculation iteration, the plurality of inputs being associated with a plurality of adaptive filters each having a plurality of taps at a calculation unit. Further, a correlation data and a cross-correlation data is determined in a given calculation iteration based thereon at the calculation unit. The method further comprises determining a plurality of adaptive weights associated with the plurality of adaptive filters, respectively, based on the correlation data and the cross correlation data at a DCD core unit, by defining a residual vector comprising the cross-correlation data. Further, the method comprises determining a convergence parameter at a convergence detector unit and generating an iteration signal based on the convergence parameter at a controller. The iteration signal communicates to the calculation unit and the DCD core unit to continue with a next iteration or to conclude. In one embodiment, the method further comprises updating the residual vector in the next iteration together with determining the cross correlation data only when the iteration signal indicates the next iteration.

The present disclosure will now be described with reference to the attached drawing figures, wherein like reference numerals are used to refer to like elements throughout, and wherein the illustrated structures and devices are not necessarily drawn to scale. As utilized herein, terms "module", "component," "system," "unit," "element," "slice," and the like are intended to refer to a computer-related entity, hardware, software (e.g., in execution), and/or firmware. For example, a unit or similar term can be a processor, a process running on a processor, a controller, an object, an executable program, a storage device, and/or a computer with a processing device. By way of illustration, an application running on a server and the server can also be a unit. One or more units can reside within a process, and a unit can be localized on one computer and/or distributed between two or more computers. A set of elements or a set of other units can be described herein, in which the term "set" can be interpreted as "one or more."

As another example, a unit or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a unit can be an apparatus that provides specific functionality through electronic components without mechanical parts; the electronic components can include one or more processors therein to execute software and/or firmware that confer(s), at least in part, the functionality of the electronic components.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Use of the word exemplary is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

As indicated above, interference mitigation is an important aspect of full duplex wireless systems. Interference mitigation in full-duplex wireless systems may employ adaptive filters to cancel non-linear noise emanating from the transmitter power amplifier (PA) leaking into the receive path. The adaptation of filter weights must converge quickly to meet performance constraints. In typical adaptive filtering applications and implementations the least mean square (LMS) adaptation algorithm is implemented due to its low computational complexity. However, an LMS-based adaptation is inadequate for fast convergence required in cancelling non-linear noise in full-duplex applications. Recursive Least Squares (RLS) algorithms recursively adapt filter coefficients to minimize the weighted linear least squares cost function and exhibit very fast convergence. However, the computational complexity of implementing RLS-based algorithms in hardware is prohibitive since it increases super-linearly as the number of weights and filters increase. In this disclosure, an area-efficient, energy efficient hardware implementation of an RLS-based dichotomous coordinated descent (DCD) algorithm that exhibits fast convergence is proposed. In particular, a hardware accelerator for DCD adaptation of filter weights of adaptive filters in full-duplex wireless system targeted towards an application specific integrated circuit (ASIC)/system-on-chip (SOC) implementation is presented. In this disclosure, algorithm optimizations and characteristics have been exploited to enable reduced memory usage and easier implementation on hardware. The hardware accelerator has a modular architecture that enables to support alternate variations of RLS algorithms, for example, conjugate gradient based RLS, in other implementations.

In the following description, examples will be described and explained in more detail with respect to interference mitigation using adaptive filters in full-duplex wireless systems. In particular, in one embodiment, a hardware accelerator for implementing the RLS-DCD algorithm used in adaptive filtering is described.

FIG. 1 depicts a simplified block diagram of a full-duplex wireless communication system 100 according to one embodiment of the disclosure. The full-duplex wireless system 100 comprises an antenna port 103, a duplexer 104, a receive signal path 106, a transmit signal path 120 and a digital front end unit 116. The antenna port 103 is configured to receive a receive signal 101 from the antenna 102 and configured to convey the receive signal 101 via the duplexer 104 to the receive signal path 106. In one embodiment, the duplexer 104 can be an electronic circuit configured to isolate signals of the receiver signal path 106 from the transmit signal path 120 while permitting them to share the common antenna 102. The receive signal path 106 comprises a low noise amplifier (LNA) circuit 108 configured to amplify the receive signal 101, a mixer circuit 110 configured to down convert the amplified receive signal 109 and an analog to digital converter (ADC) 112 configured to digitize the down converted receive signal 111 to get an Rx input signal 113. In some embodiments, the receive signal path 106 comprises additional components, for example an upsampling unit, an automatic gain control block (AGC) etc. In some embodiments, the LNA 108 comprises electronic circuitry and can be implemented fully in hardware or as a combination of hardware/software. Further, the mixer 110 can comprise an electronic circuit comprising a plurality of electronic components like transistors, diodes etc. and can be implemented fully in hardware or as a combination of hardware and software. Furthermore, the ADC 112 can comprise electronic circuitry and can be implemented fully in hardware or as a combination of hardware/software. The full-duplex wireless communication system 100 further comprises an interference cancellation apparatus 114 configured to reduce the interference in the Rx input signal 113 from a transmit signal in the transmit signal path 120. The interference cancellation apparatus 114 can comprise electronic circuitry and can be implemented fully in hardware or as a combination of hardware/software. The transmit signal path 120 further comprises a digital to analog converter (DAC) 124, an upconverter/mixer 122 and a power amplifier (PA) 118 configured to process and amplify a transmit signal from the digital front end unit 116 and convey the transmit signal via the duplexer 104 to the antenna port 103.

In some embodiments, the interference cancellation apparatus 114 comprises an adaptive filter unit (not shown) configured to filter the digitized receive signal 113 by selectively adjusting the filter weights and generate a filtered output signal 126. Further, the interference cancellation apparatus 114 comprises a hardware accelerator unit (not shown) configured to implement a recursive algorithm based on which the filter weights of the adaptive filter unit are adjusted. In some embodiments, the interference cancellation apparatus 114 is configured to receive both the Rx input signal 113 and the transmit signal from the transmit signal path 120 and is configured to generate a processed input signal, based on which the filter weights of the adaptive filter unit is computed. In some embodiments, the receive signal 101 can comprise a plurality of receive signals and the antenna port 103 is configured to receive the plurality of receive signals. In some embodiments, the interference cancellation apparatus 114 comprises a plurality of adaptive filters configured to filter a plurality of receive signals and the hardware accelerator unit can be configured to selectively adjust the filter weights of the plurality of adaptive filters.

Figure 2A:
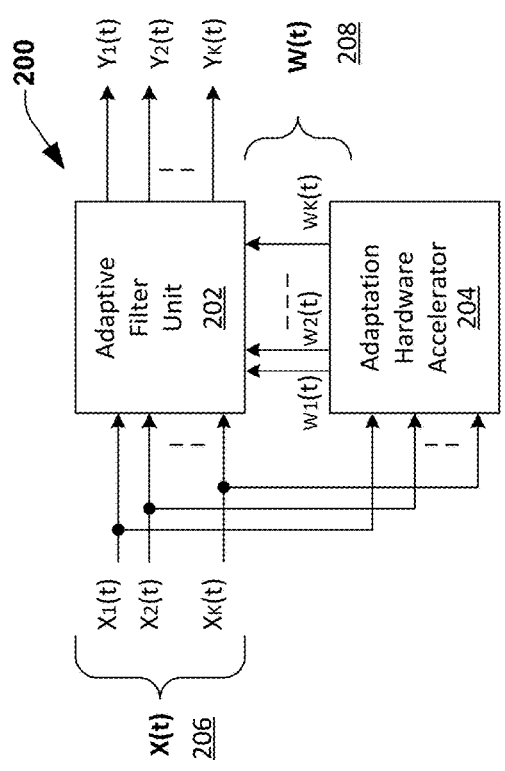
FIG. 2a shows a simplified block diagram of an interference cancellation apparatus 200 in a full duplex wireless system, according to one embodiment of the disclosure.

FIG. 2a depicts a simplified block diagram of an interference cancellation apparatus 200 in a full-duplex wireless system, according to one embodiment of the disclosure. The interference cancellation apparatus 200 comprises an adaptive filter unit 202 configured to receive an input signal X(t) 206 and is configured to filter the input signal X(t) 206 by selectively adjusting the filter weight w(t) 208 of the adaptive filter unit 202. In some embodiments, the input signal X(t) 206 comprises signals from both a receive signal path and a transmit signal path of a transceiver. The adaptive filter unit 202 can be realized either as a set of program instructions running on an arithmetical processing device such as a microprocessor or DSP chip, or as a set of logic operations implemented in a field-programmable gate array (FPGA) or in a semicustom or custom VLSI integrated circuit. In some embodiments, the input signal X(t) 206 comprises a plurality of input signals $X1(t), X2(t) \ldots Xk(t)$ and the adaptive filter unit 202 comprises a plurality of adaptive filters (not shown) configured to filter the plurality of input signals $X1(t), X2(t) \ldots Xk(t)$ respectively. Further, the plurality of adaptive filters in the adaptive filter unit 202 comprises a plurality of filter weights $w1(t), w2(t) \ldots wk(t)$ associated therewith respectively. In some embodiments, the adaptive filter unit 202 is configured to filter the plurality of input signals $X1(t), X2(t) \ldots Xk(t)$ based on the plurality of filter weights $w1(t), w2(t) \ldots wk(t)$ and generate a plurality of outputs $Y1(t), Y2(t) \ldots Yk(t)$ based thereon. Further, the interference cancellation apparatus 200 comprises a hardware accelerator unit 204 configured to receive the plurality of input signals $X1(t), X2(t) \ldots Xk(t)$ and generate the plurality of filter weights $w1(t), w2(t) \ldots wk(t)$ associated with the plurality of adaptive filters. The filter weights $w1(t), w2(t) \ldots wk(t)$ are adjusted based on a recursive algorithm and the hardware accelerator unit 204 is configured to implement the recursive algorithm as will be discussed in greater detail below. In some embodiments, the hardware accelerator unit 204 is configured to receive the plurality of input signals $X1(t), X2(t) \ldots Xk(t)$ at one or more predefined time intervals, each time interval corresponding to a calculation iteration of the recursive algorithm. In some implementations, the recursive algorithm comprises an RLS based dichotomous coordinated descent (DCD) algorithm that recursively adapt the filter weights $w1(t), w2(t) \ldots wk(t)$ to minimize a weighted linear least squares cost function, and exhibits very fast convergence.

To implement the RLS DCD algorithm stated above, the equations that need to be computed are as provided below:

$$R(t) = \lambda R(t-1) + X_t^H X_t \quad (1)$$

$$\beta_0(t) = \lambda r(t-1) + X_t^H z_t \quad (2)$$

$$r(t) = \beta_0(t) \quad (3)$$

$$\text{for } m = 1{:}1{:}Mb \ (Mb = 8) \quad (4)$$

$$a = a/2 \quad (5)$$

$$r_n = \max\{|\Im(r(t)|, |R(r(t))|\} \quad (6)$$

$$\text{if } |r_n| > \left(\frac{\alpha}{2}\right) R_{n,n} \quad (7)$$

$$\Delta W(t) = \Delta W(t-1) + \text{sign}(r_n) a \quad (8)$$

$$r(t) = r(t) - \text{sign}(r_n) a R(t)^n \quad (9)$$

$$R(t+1) = \lambda R(t) + X_{t+1}^H X_{t+1} \quad (10)$$

$$\beta_0(t+1) = \lambda r(t) + X_{t+1}^H z_{t+1} \quad (11)$$

wherein R(t) is a correlation vector, $\beta_0(t)$ is a cross-correlation vector and $\Delta W(t)$ is the filter weight computed based on the correlation vector and the cross-correlation vector. Equations (1) to (9) represent a first calculation iteration and equations (10) and (11) represents a second calculation iteration.

Figure 2B:
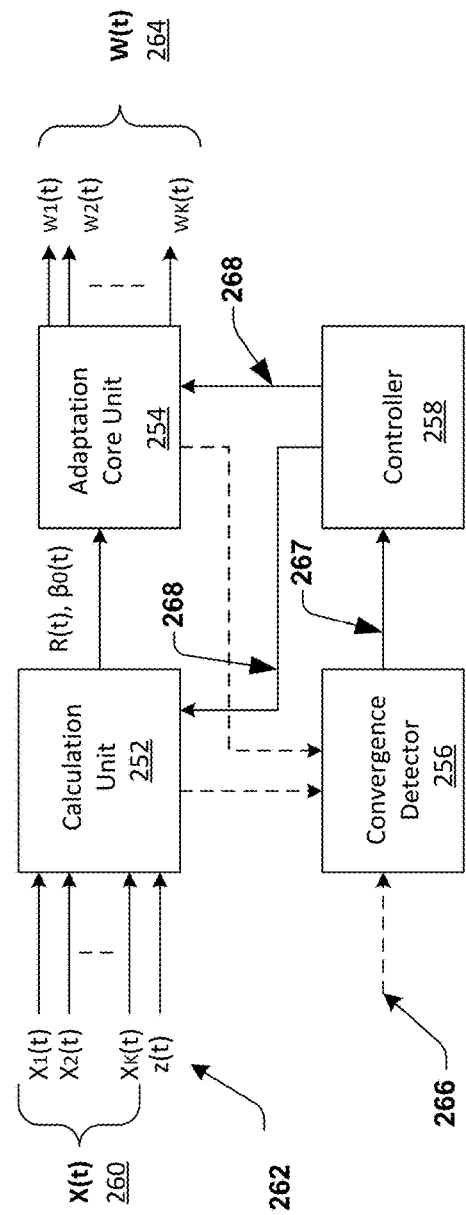
FIG. 2b shows a simplified block diagram of an adaptation hardware accelerator unit 250 for implementing the RLS DCD algorithm, according to one embodiment of the disclosure.

FIG. 2b depicts a simplified block diagram of a hardware accelerator unit 250 for implementing the RLS DCD algorithm given above, according to one embodiment of the disclosure. In some embodiments, the hardware accelerator unit 250 is implemented as part of an interference cancellation apparatus in full-duplex wireless systems for selectively adjusting the filter weights of a plurality of adaptive filters. However, in other embodiments, the hardware accelerator unit 250 can be implemented for adapting the filter weights in other applications as well. The hardware accelerator unit 250 can be realized either as a set of program instructions running on an arithmetical processing device such as a microprocessor or DSP chip, or as a set of logic operations implemented in a field-programmable gate array (FPGA) or in a semicustom or custom VLSI integrated circuit. The hardware accelerator unit 250 comprises a calculation unit 252 configured to receive an input X(t) 260 comprising one or more input signals X1(t), X2(t) . . . Xk(t) and a desired input response z(t) 262, and determine a correlation vector R(t) and a cross correlation vector β_0(t) based thereon. The calculation unit 252 can comprise computational elements for R(t) updates and β_0(t) updates, for example, for implementing the equations (1) and (2) above, and memory elements for storing the R(t) and β_0(t) data. In some embodiments, the computational elements for determining R(t) updates and β_0(t) updates are integrated with the memory elements for storing the R(t) and β_0(t) data. In some implementations, the calculation unit 252 comprises, simplifies and optimized storage requirements, the details of which are given in the subsequent sections below.

The hardware accelerator unit 250 further comprises an adaptation core unit 254 configured to receive the correlation vector R(t) and the cross correlation vector β_0(t) from the calculation unit 252 and determine filter weights w1(t), w2(t) . . . wk(t) for one or more of a plurality of adaptive filters (not shown) respectively based on an adaptive RLS-based algorithm. In some implementations, the adaptation core unit 254 comprises a DCD core unit configured to determine the filter weights w1(t), w2(t) . . . wk(t) based on the RLS DCD algorithm by implementing the equations (3) to (8) above. In some embodiments, the calculation unit 252 is configured to take input samples X1(t), X2(t) . . . Xk(t) at predefined time intervals, each of which corresponds to a calculation iteration. Further, the hardware accelerator unit 250 comprises a convergence detector unit 256 configured to determine a convergence parameter 267. In some embodiments, the convergence parameter 267 can be determined based on the parameters of the calculation unit 252 or the DCD core unit 254. However, in other embodiments, the convergence parameter 267 can be determined based on an external factor 266. In addition, the hardware accelerator unit 250 comprises a controller 258 configured to generate an iteration signal 268 based on the convergence parameter 267, wherein the iteration signal 268 communicates to the calculation unit 252 and the DCD core unit 254 to continue with a next calculation iteration or to conclude, wherein the conclusion indicates a determination of a final value of the plurality of the adaptive weights by the DCD core unit 254. The next calculation iteration is implemented by implementing the equations (10) and (11) for determining R(t+1) and β_0(t+1) in the calculation unit 252 and by implementing equations (3) to (8) for determining an update for the filter weights w1(t), w2(t) . . . wk(t) based on the values of R(t+1) and β_0(t+1). In some implementations, the controller 258 is configured to perform a plurality of iterations until the convergence parameter 267 satisfies a predetermined condition.

Figure 3:
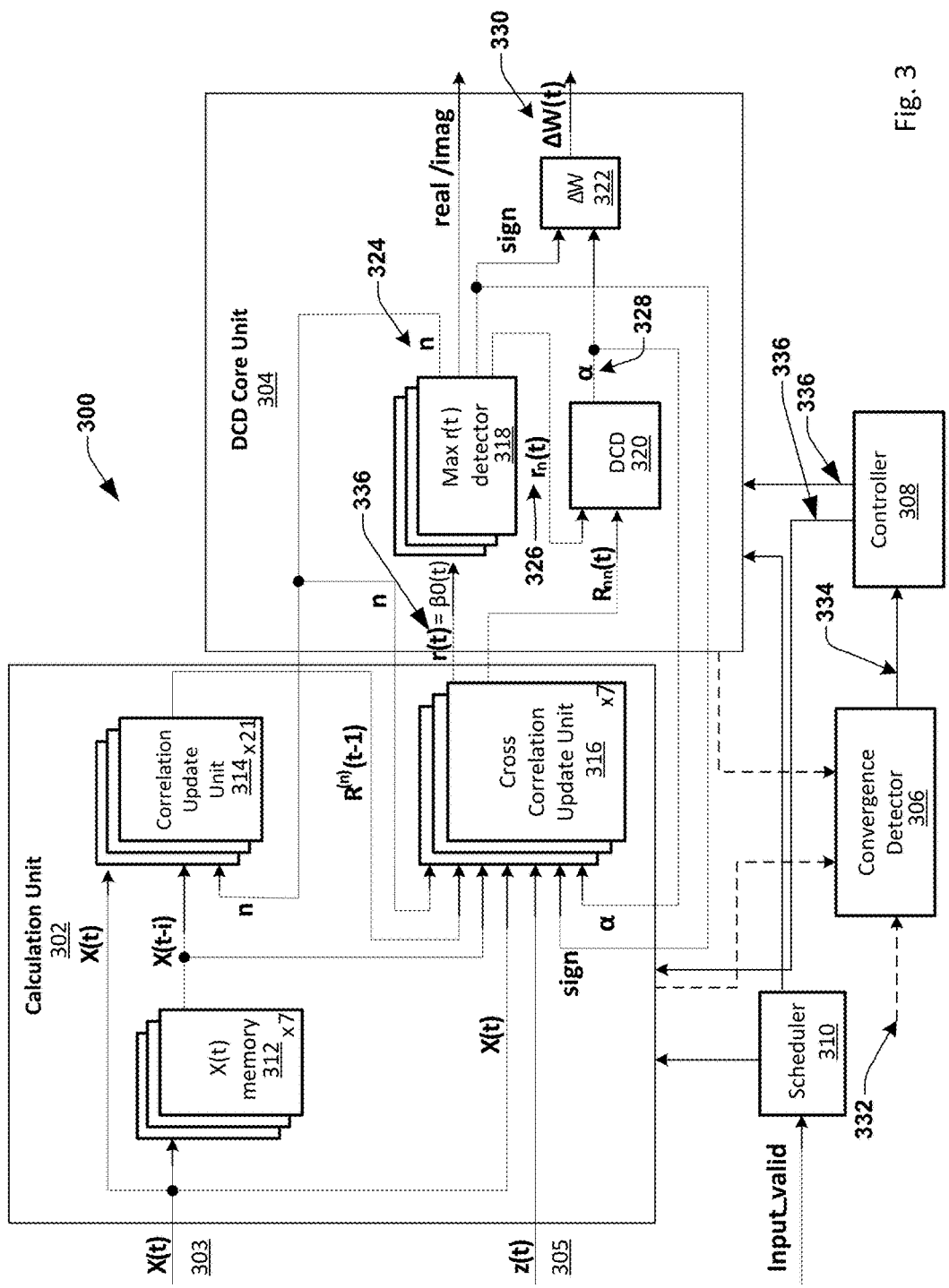
FIG. 3 shows a simplified block diagram of an example implementation of an adaptation hardware accelerator unit 300 for implementing the RLS DCD algorithm, according to one embodiment of the disclosure.

FIG. 3 depicts a simplified block diagram of an example implementation of a hardware accelerator unit 300 for implementing the RLS DCD algorithm given above, according to one embodiment of the disclosure. The hardware accelerator unit 300 comprises a calculation unit 302, a DCD core unit 304, a convergence detector 306 and a controller 308. Further, the hardware accelerator unit 300 comprises a scheduler 310 configured to control and sequence data to the calculation unit 302 and the DCD core unit 304. The calculation unit 302 is configured to receive an input vector X(t) 303 and a desired input response z(t) 305, and configured to determine a correlation vector and a cross-correlation vector based thereon. In some embodiments, the input vector X(t) 303 comprises a plurality of inputs X1(t), X2(t) . . . Xk(t) corresponding to a plurality of adaptive filters (not shown). Further, each of the plurality of inputs X1(t), X2(t) . . . Xk(t) comprises N elements, wherein N corresponds to the number of taps of the adaptive filters. The calculation unit 302 has a modular architecture in one embodiment, which allows designers to integrate the calculation unit 302 with other types of RLS based adaptation cores in addition to the DCD core 304. In some implementations, the input memory unit 312, correlation update unit 314, cross-correlation update unit 316 and the maximum detector unit 318 comprises single slices or elements, when the hardware accelerator unit 300 is configured to determine the filter weights of a single filter. Each slice can comprise a plurality of gates, adders, multipliers etc. to perform a logic operation. However, in other implementations where multiple filters are used, the input memory unit 312, correlation update unit 314, cross-correlation update unit 316 and the maximum detector unit 318 in the hardware accelerator unit 300 can comprise a plurality of slices or elements depending on the number of inputs or number of computations.

The calculation unit 302 further comprises a input memory unit 312 configured to store the plurality of inputs X1(t), X2(t) . . . Xk(t), a correlation update unit 314 configured to determine a correlation vector R(t) and a cross-correlation update unit 316 configured to determine a cross-correlation vector β_0(t). In some embodiments, correlation update unit 314 comprises a correlation memory configured to store the correlation data, however in other embodiments, the correlation memory can be implemented as a separate unit different from the correlation update unit 314. Similarly, in some embodiments, the cross-correlation update unit 316 comprises a cross-correlation memory configured to store the cross-correlation data, however, in other embodiments, the cross-correlation memory can be implemented as a separate unit different from the cross-correlation update unit 316. In some embodiments, the correlation vector R(t) comprises a correlation matrix R[K×K], wherein K corresponds to the number of inputs of the calculation unit 302 and each of the elements of the correlation matrix R[K×K] comprises a correlation sub-matrix Rsub[N×N], wherein N corresponds to the number of taps of the adaptive filters. In some embodiments, the correlation update unit 314 is configured to determine only the elements in an upper triangular portion of the correlation matrix R[K×K], while the elements in a diagonal portion of the correlation matrix R[K×K] are determined in conjunction with the determination of cross-correlation vector β_0(t) in the cross-correlation update unit 316.

The DCD core unit 304 is located downstream of the calculation unit 302 and is configured to determine a plurality of filter weights Δw(t) 330 associated with the plurality of adaptive filters respectively, based on the correlation data and cross-correlation data determined in the calculation unit 302. In some embodiments, the determination of the plurality of filter weights Δw(t) 330 is initiated by defining a residual vector r(t) 336 comprising the cross-correlation vector β_0(t) as shown in equation (3) above, in the DCD core unit 304. The DCD core unit 304 further comprises a maximum detector unit 318 configured to receive the residual vector r(t) 336 and determine a residual index n 324 and a residual parameter $r_n(t)$ 326 by implementing the equation (6) above. The residual index n 324 is used to get the value of $R_{n,n}$ from the diagonal elements of the correlation matrix R[K×K]. The DCD core unit 304 further comprises a DCD computation unit 320 configured to determine a step size a 328 by implementing the comparison between the residual parameter $r_n(t)$ 326 and $R_{n,n}$ in equation (7) above. In addition, the DCD core unit 304 comprises a filter weight computation unit ΔW 322 configured to determine the plurality of filter weights 330 associated with the plurality of adaptive filters respectively, by implementing the equation (8) above. In some implementations, the DCD core unit 304 can be substituted with other units configured to implement alternate algorithms, for example, conjugate gradient descent algorithm.

In some embodiments, the calculation unit 302 is configured to take input samples X1(t), X2(t) . . . Xk(t) at predefined time intervals, each of which corresponds to a calculation iteration. The convergence detector unit 306 is configured to determine a convergence parameter 334. In some embodiments, the convergence parameter 334 can be determined based on the parameters of the calculation unit 302 or the DCD core unit 304. However, in other embodiments, the convergence parameter 334 can be based on an external factor 332. In some implementations, the convergence detector unit 306 could be embodied as part of the hardware accelerator units configured to implement any RLS-based algorithms. The controller 308 is configured to generate an iteration signal 336 based on the convergence parameter 334, wherein the iteration signal 336 communicates to the calculation unit 302 and the DCD core unit 304 to continue with a next calculation iteration or to conclude, wherein the conclusion indicates a determination of a final value of the plurality of the adaptive weights by the DCD core unit 304.

In this implementation, the r(t) update in equation (9) is integrated with the $β_0(t+1)$ update in equation (11) above. Thus, the residual vector r(t) update equation (9) is eliminated from each calculation iteration and is updated together with updating $β_0(t)$, for example, while determining $β_0(t+1)$ in the cross-correlation update unit 316, only when the iteration signal 336 indicates a next calculation iteration. This eliminates the need to access β memory twice in each iteration. In some implementations, this optimized scheduling reduces the β-memory accesses by 50% and saves power accordingly. In order to update the residual vector r(t) together with determining $β_0(t+1)$ in equation (11), the equation (11) is modified based on equation (9) as below:

$$β_0(t+1)=λ(r(t)-\text{sign}(r_n)aR(t)^n)+X_{t+1}^H z_{t+1} \quad (12)$$

FIG. 4a represents an input matrix X[K×N] 400 for a generalized K-filter N-tap system. FIG. 4b represents a correlation matrix R[K×K] 450 for the generalized K-filter N-tap system. The correlation matrix 450 comprises a plurality of elements each of which comprises a sub-matrix Rsub[N×N] 456. For a generalized K-filter N-tap system (Z=N×K), the correlation update equations are as shown below:

$$X(t) = [\ X_t^{(1)},\ X_t^{(2)},\ \ldots,\ X_t^{(K)}\ ]_{1 \times z} \quad (13)$$

$$R(t) = λR(t-1) + X_t^H X_t = \begin{bmatrix} R_{11}(t) & \ldots & R_{1K}(t) \\ \vdots & & \vdots \\ R_{K1}(t) & \ldots & R_{KK}(t) \end{bmatrix} \quad (14)$$

$$R_{a,b} = \quad (15)$$

$$Xt^{(a)H} Xt^{(b)} = \begin{bmatrix} \sum_{k=0}^{\infty} λ X_{t-K}^{(a)*} X_{t-K}^{(b)} & \ldots & \sum_{k=0}^{\infty} λ X_{t-K}^{(a)*} X_{t-N+1-K}^{(b)} \\ \vdots & & \vdots \\ \sum_{k=0}^{\infty} λ X_{t-N+1-K}^{(a)*} X_{t-K}^{(b)} & \ldots & \sum_{k=0}^{\infty} λ X_{t-N+1-K}^{(a)*} X_{t-N+1-K}^{(b)} \end{bmatrix}$$

$$x_t^{(a)H}[x_t^{(B)}, \ldots, x_{t-N+1}^{(b)}] + λ[oldRow], x_t^{(b)} \begin{bmatrix} x_t^{(a)H} \\ \vdots \\ x_{t-N+1}^{(a)H} \end{bmatrix} + λ[oldcolumn] \quad (16)$$

wherein R(t) is equivalent to the correlation matrix 450 and $R_{a,b}$ is equivalent to each of the sub-matrices Rsub 456. The above computations are the same for any RLS-based adaptive algorithms.

The above structure of $R_{a,b}$ as given in equation (15) above allows a fast update to the next $R_{a,b}$ at time t+1, where equation (15) could be interpreted as equation (16). Accordingly, only a first row and a first column needs to be updated for each sub-matrix Rsub 456. Further, the correlation matrix R 450 is always Hermitian, thus only the upper triangular matrix 452 of the correlation matrix R 450 needs to be considered. The upper triangular matrix 452 comprises a diagonal portion 454 comprising the diagonal elements of the correlation matrix R 450 and an upper triangular portion comprising all the elements above the diagonal portion with the exception of the diagonal portion, in the upper triangular matrix 452. Further due to the Hermitian property, only a first row or a first column needs to be updated for the sub-matrices on the diagonal portion 454, for example, Rsub_diagonal 458 of the correlation matrix R 450, as illustrated in FIG. 4b. Therefore, the complexity for calculating the correlation matrix R 450 can be reduced from $O(N^2)$ to $O(N)$. Further, the storage resources required to store the correlation data is also greatly reduced. Eliminating the computation overhead serves as a key enabler for an energy/area-efficient hardware realization of any RLS-based adaptive algorithm.

Figure 5:
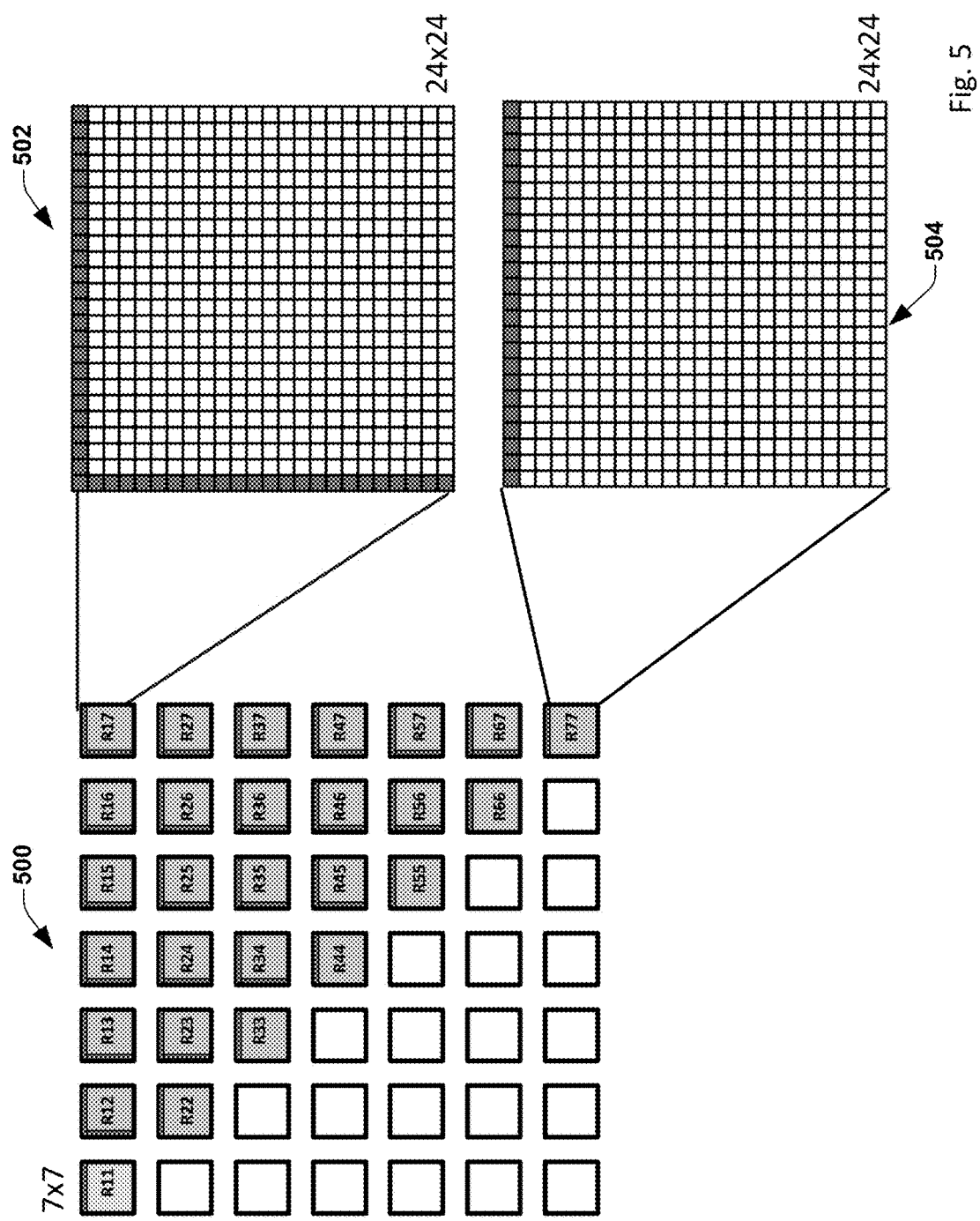
FIG. 5 shows an example implementation of the storage requirement of a correlation matrix R 500 for a 7-filter 24-tap system, according to one embodiment of the disclosure.

FIG. 5 shows an example implementation of a correlation matrix R 500 for a 7-filter 24-tap system. The correlation matrix R 500 is a 7×7 matrix comprising 47 R(t) elements/slices. Each R(t) element further comprises a 24×24 sub-matrix R_sub 502. Due to the Hermitian property of the correlation matrix R 500, only 7 slices/elements of the diagonal of the correlation matrix R 500 and 21 off-diagonal slices/elements of the correlation matrix R 500 needs to be calculated in each iteration, rather than the entire 49 elements of the correlation matrix R 500. Further, only the first row and the first column needs to be computed for each of the 21 off-diagonal slices/elements, for example 502 and only the first row or the first column needs to be computed for each of the 7 slices/elements on the diagonal of the correlation matrix R 500, for example 504. These optimizations are true for any RLS-based adaptive algorithms.

Figure 6:
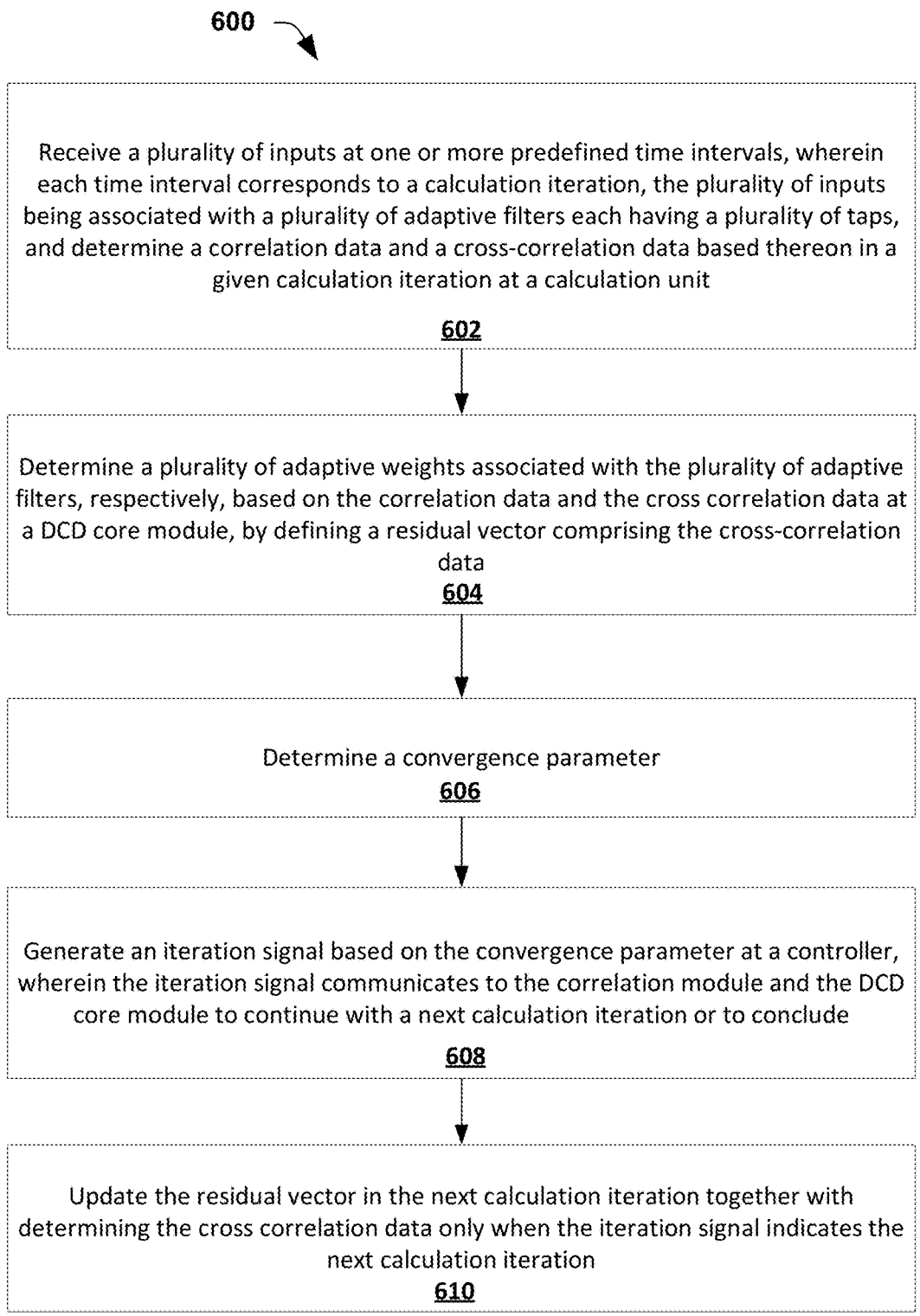
FIG. 6 shows a flowchart of a method 600 for implementing an RLS based DCD algorithm hardware in full duplex wireless systems, according to one embodiment of the disclosure.

FIG. 6 shows a flowchart of a method 600 for implementing an RLS based DCD algorithm in hardware in full duplex wireless systems, according to one embodiment of the disclosure. The method 600 is described herein with respect to the hardware accelerator unit 300 in FIG. 3. At 602, a plurality of inputs X(t) 303 associated with a plurality of adaptive filters (not shown) is received at an input of the calculation unit 302, and a correlation data R(t) and a cross-correlation data $\beta_0(t)$ are determined based on the plurality of inputs X(t) 303. In some embodiments, the plurality of inputs X(t) 303 are received in one or more predefined time intervals, wherein each time interval corresponds to a calculation iteration. At 604, a plurality of adaptive weights $\Delta W(t)$ 330 associated with the plurality of adaptive filters are determined based on the correlation data and the cross correlation data at the DCD core unit 304, by defining a residual vector r(t) 336 comprising the cross-correlation data $\beta_0(t)$. At 606, a convergence parameter 334 is determined at a convergence detector unit 306. At 608, an iteration signal 336 is generated based on the convergence parameter 334 at a controller 308, wherein the iteration signal 336 communicates to the calculation unit 302 and the DCD core unit 304 to continue with a next calculation iteration or to conclude. For example, when the convergence parameter 334 exceeds or falls below a predetermined threshold, sufficient convergence is determined to stop the algorithm. At 610, the residual vector r(t) 336 is updated in the next calculation iteration together with determining the cross correlation data $\beta_0(t+1)$ only when the iteration signal 336 indicates the next calculation iteration.

While the methods are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Figure 7:
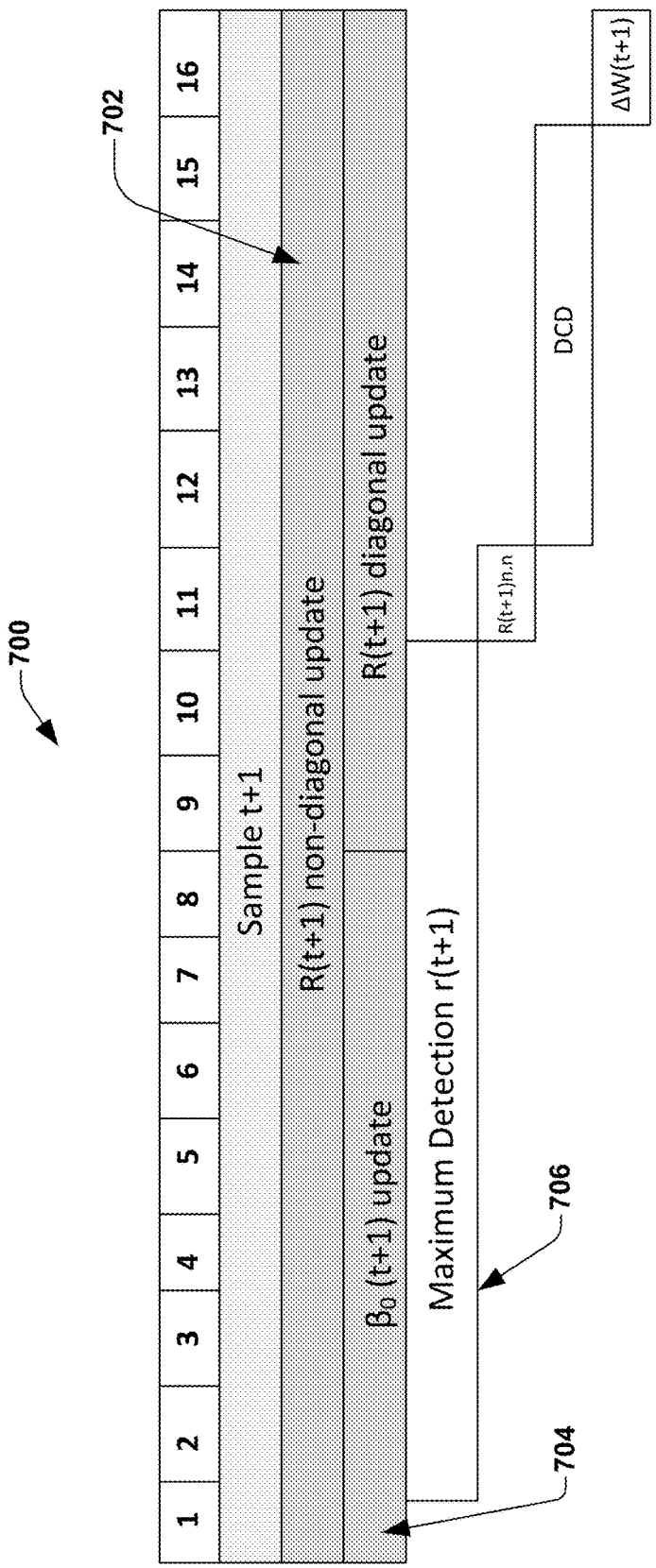
FIG. 7 shows an example implementation of the scheduling of the steps of the RLS DCD algorithm in conjunction with the adaptation hardware accelerator unit 300 of FIG. 3, according to one embodiment of the disclosure.

FIG. 7 shows an example implementation of the scheduling of the steps of the RLS DCD algorithm given in equations (1) to (8) above in conjunction with the hardware accelerator unit 300 of FIG. 3, according to one embodiment of the disclosure. In this example implementation, we choose 16 cycles to complete one iteration of the RLS-DCD algorithm. In the given example, for a sample t+1, the implementation of the algorithm begins by the computation of R(t+1) non-diagonal update at 702 using the equation (1). Simultaneously, the computation of $\beta0(t+1)$ is scheduled at 704 based on equation (2). While the original or conventional algorithm would start the maximum detection using equation (6) above upon finishing the correlation calculation at 702, this design takes advantage of the available cross-correlation data at 704 in the correlation calculation phase 702, thereby scheduling the maximum detection phase 706 almost in parallel with the correlation calculation phase at 702. This design greatly enhances the throughput by reducing the latency. Further, this design improves hardware resource utilization as well as enables efficient implementation due to optimal scheduling. In some embodiments, this scheduling could be done using the scheduler 310 in FIG. 3. Alternatively, in other embodiments, the scheduling could be performed using other components or controller circuits. Further, in other embodiments, the scheduling of the correlation calculation, cross-correlation calculation and the maximum detection calculation can be performed differently than explained above.

Figure 8:
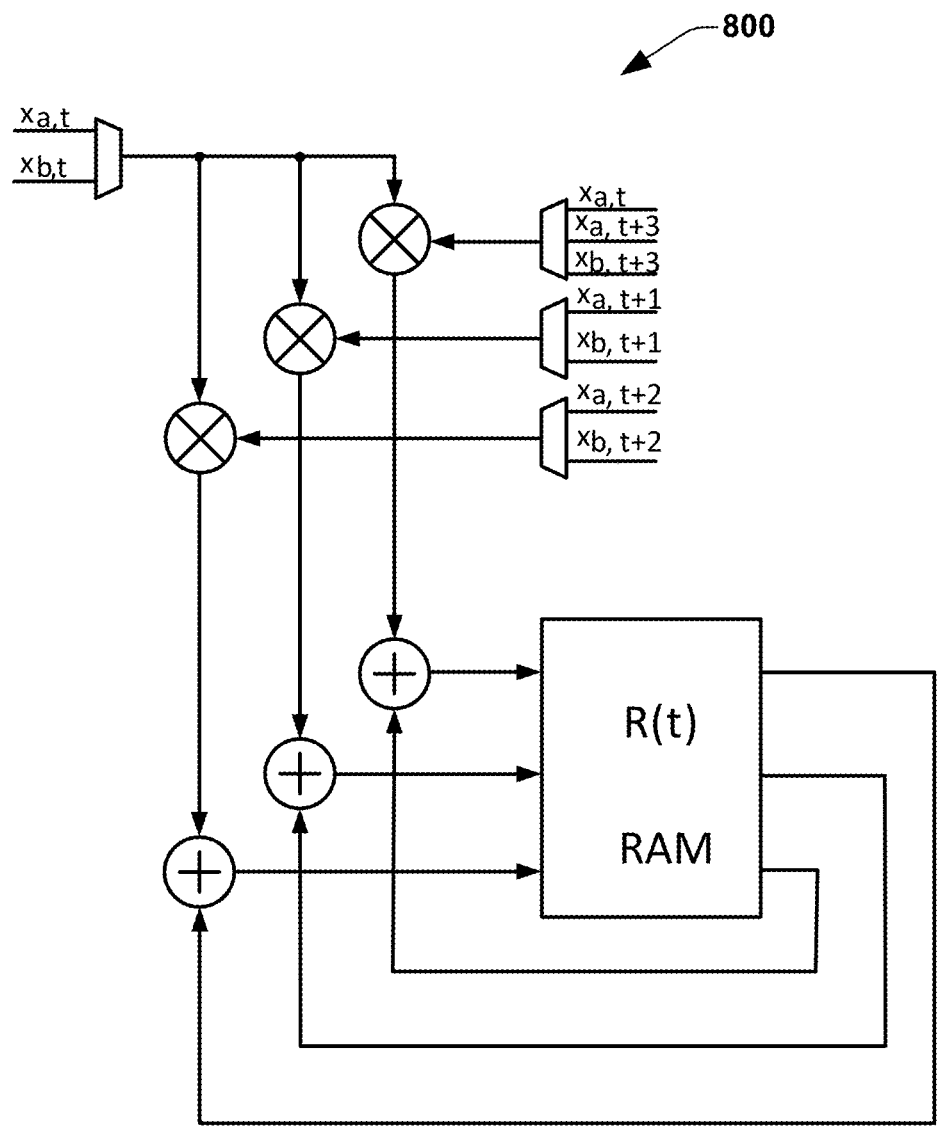
FIG. 8 shows an example implementation of a R off-diagonal update slice 800, which could be included in the correlation update unit 314 of FIG. 3, according to one embodiment of the disclosure.

FIG. 8 shows an example implementation of a R off-diagonal update slice circuit 800, which could be included in the correlation update unit 314 of FIG. 3, according to one embodiment of the disclosure. The R off-diagonal update slice circuit 800 is configured to receive a plurality of inputs and comprises a plurality of gates, adders and multipliers configured to generate the diagonal elements of the correlation vector R(t) based on the equation (1) above. Further, the R off-diagonal update slice circuit 800 comprises a R(t) memory configured to store the off-diagonal elements of the correlation vector R(t). In this example implementation, 3 multipliers are used per slice, however, in other implementations, a different number of multipliers could be used.

Figure 9:
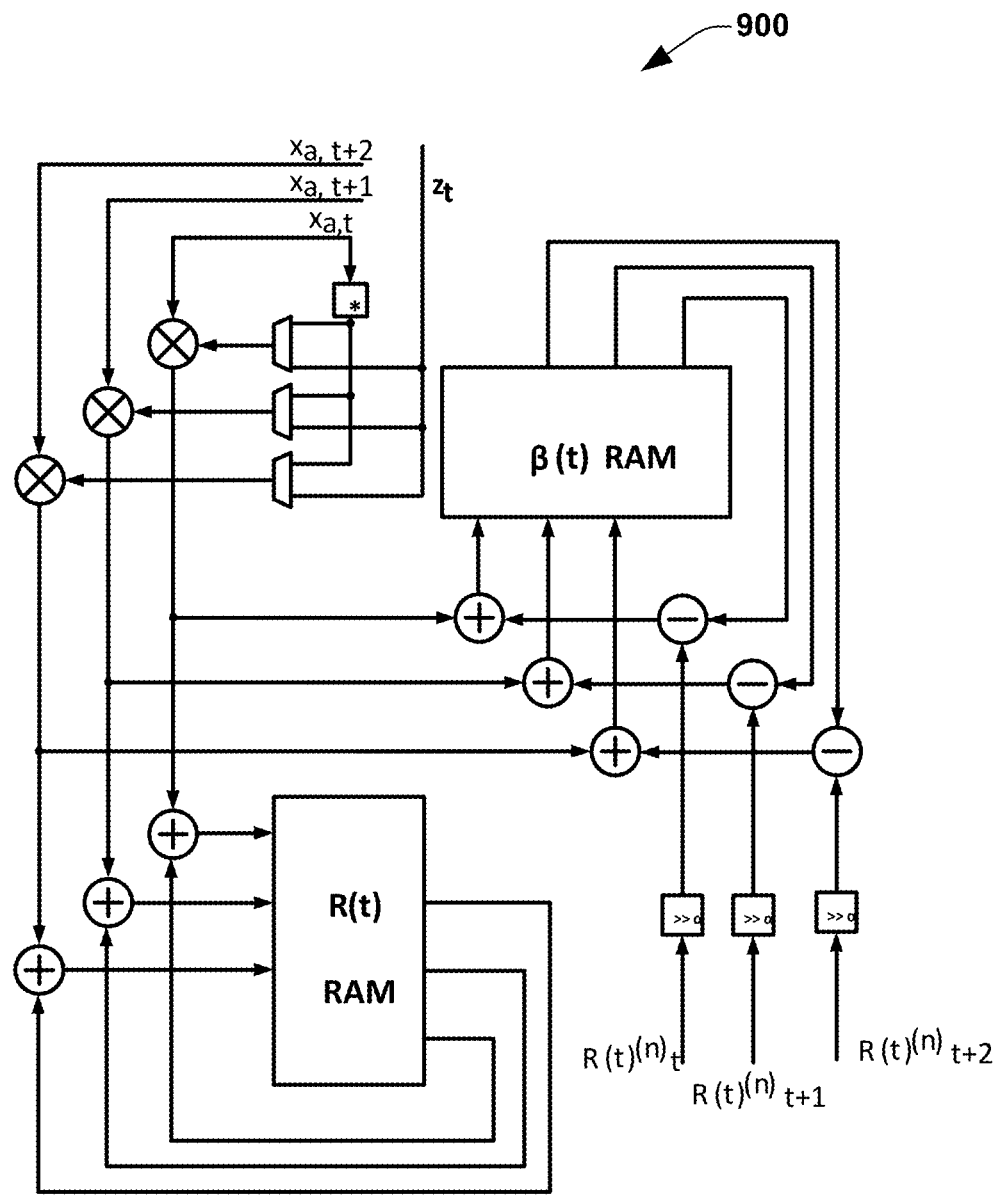
FIG. 9 shows an example implementation of a β update slice 900, which could be included in the cross-correlation update unit 314 of FIG. 3, according to one embodiment of the disclosure.

FIG. 9 shows an example implementation of a $\beta$ update slice circuit 900, which could be included in the cross-correlation update unit 314 of FIG. 3, according to one embodiment of the disclosure. The $\beta$ update slice circuit 900 is configured to receive a plurality of inputs and comprises a plurality of gates, adders and multipliers configured to generate a cross-correlation vector $\beta_0(t)$ based on the equation (2) above. In some implementations, the $\beta$ update slice circuit 900 is also configured to determine the diagonal elements of the correlation vector based on the equation (1) above. The $\beta$ update slice circuit 900 further comprises a R(t) memory to store the diagonal elements of the correlation vector R(t) and a $\beta$ memory to store the cross-correlation vector $\beta_0(t)$. In this example implementation, 3 multipliers are used per slice, however, in other implementations, a different number of multipliers could be used.

Figure 10:
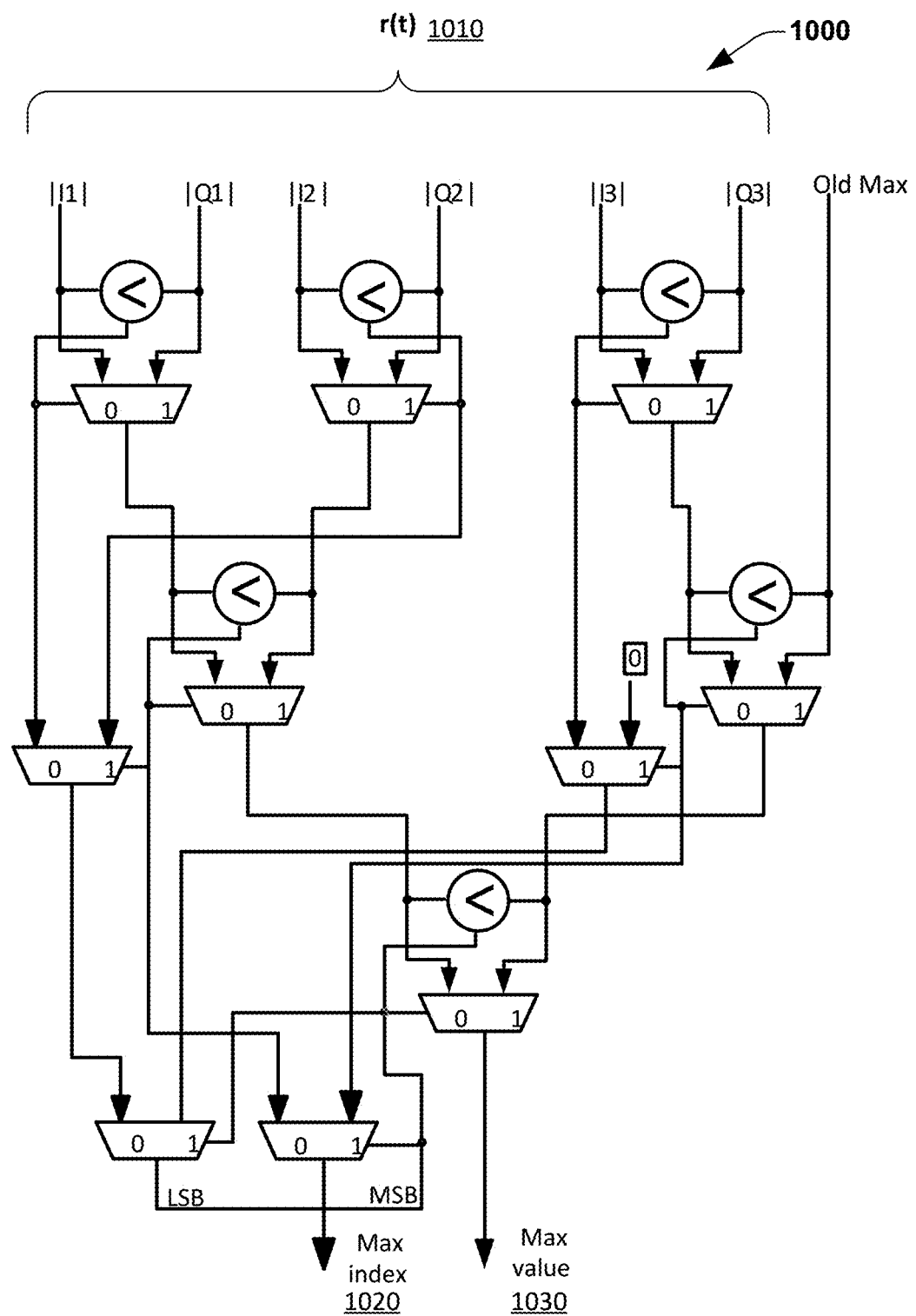
FIG. 10 shows an example implementation of a maximum detection unit 1000, according to one embodiment of the disclosure.

FIG. 10 shows an example implementation of a maximum detection unit or circuit 1000, according to one embodiment of the disclosure. In some embodiments, the maximum detection unit or circuit 1000 can be a part of the max r(t) detector unit 318 in FIG. 3. The maximum detection unit or circuit 1000 is configured to receive a residual vector r(t) 1010 and comprises a plurality of logic gates configured to generate a maximum residual index n 1020 associated with a maximum residual parameter $r_n$ 1030 by implementing the equation (6) above.

Figure 11:
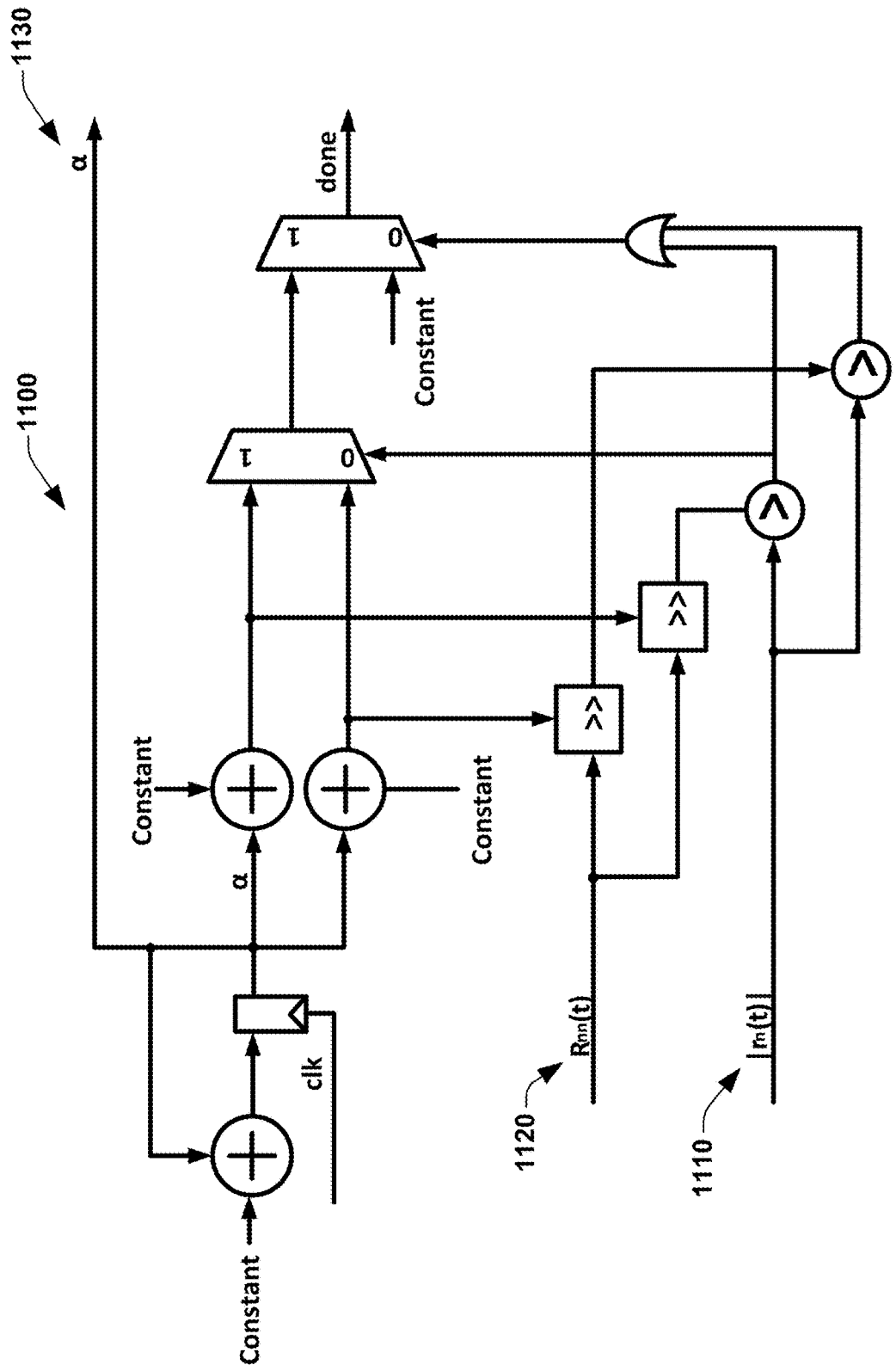
FIG. 11 shows an example implementation of a DCD computation unit 1100, according to one embodiment of the disclosure.

FIG. 11 shows an example implementation of a slice of a DCD computation circuit 1100, according to one embodiment of the disclosure. In some embodiments, the DCD computation circuit 1100 can be a part of the DCD computation unit 320 of FIG. 3. The DCD computation circuit 1100 is configured to receive a residual parameter $r_n$ 1110 and $R_{n,n}(t)$ 1120 and comprises a plurality of logic gates, adders and shifters configured to determine a step size a 1130 by implementing the equation (7) above.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is an adaptation hardware accelerator, comprising: a calculation unit configured to receive a plurality of inputs at one or more predefined time intervals, wherein each time interval corresponds to a calculation iteration, the plurality of inputs being associated with a plurality of adaptive filters each having a plurality of taps, and determine a correlation data and a cross-correlation data based thereon for a given calculation iteration, wherein the correlation data comprises a correlation matrix comprising a plurality of sub-matrices, wherein determining the correlation matrix comprises determining only the submatrices in an upper triangular portion and a diagonal portion of the correlation matrix; an adaptation core unit configured to determine a plurality of adaptive weights associated with the plurality of adaptive filters, respectively, in the given calculation iteration based on the correlation data and the cross correlation data; a convergence detector unit configured to determine a convergence parameter; and a controller configured to generate an iteration signal for each of the predefined time intervals based on the convergence parameter, wherein the iteration signal communicates to the calculation unit and the adaptation core unit to continue with a next calculation iteration or to conclude, wherein the conclusion indicates a determination of a final value of the plurality of the adaptive weights by the adaptation core unit.

Example 2 is a hardware accelerator including the subject matter of example 1, wherein determining the sub-matrices in the upper triangular portion of the correlation matrix comprises determining only a first row and a first column in each of the sub-matrices in the upper triangular portion.

Example 3 is a hardware accelerator including the subject matter of examples 1-2, including or omitting elements, wherein determining the sub-matrices in the diagonal portion of the correlation matrix comprises determining a first row or a first column in each of the sub-matrices in the diagonal portion.

Example 4 is a hardware accelerator including the subject matter of examples 1-3, including or omitting elements, wherein the correlation matrix is a K*K matrix, wherein K corresponds to the number of inputs of the calculation unit.

Example 5 is a hardware accelerator including the subject matter of examples 1-4, including or omitting elements, wherein each of the plurality of sub-matrices is a K*N matrix, wherein K corresponds to the number of inputs of the calculation unit and N corresponds to the number of taps of the adaptive filters.

Example 6 is a hardware accelerator including the subject matter of examples 1-5, including or omitting elements, wherein the adaptation core unit is configured to determine the plurality of adaptive weights based on an optimized adaptive recursive least squares (RLS) based algorithm.

Example 7 is a hardware accelerator including the subject matter of examples 1-6, including or omitting elements, wherein the (RLS) based algorithm comprises a dichotomous coordinated descent (DCD) algorithm and determining the plurality of adaptive weights comprises defining a residual vector comprising the correlation data and determining the plurality of adaptive weights based on the defined residual vector, wherein the defined residual vector is updated in the next calculation iteration together with determining the cross correlation data in the correlation unit, only when the iteration signal indicates the next calculation iteration.

Example 8 is a hardware accelerator including the subject matter of examples 1-7, including or omitting elements, further comprising a scheduler configured to schedule the operations of the calculation unit and the adaptation core unit.

Example 9 is a hardware accelerator including the subject matter of examples 1-8, including or omitting elements, wherein the calculation unit comprises: an input memory unit configured to store the plurality of inputs; a correlation update unit configured to determine the correlation data based on the inputs stored in the input memory unit; and a cross correlation update unit configured to determine the cross correlation data based on the inputs stored in the input memory unit.

Example 10 is a hardware accelerator including the subject matter of examples 1-9, including or omitting elements, wherein the correlation update unit further comprises a correlation memory integrated within and configured to store the determined correlation data.

Example 11 is a hardware accelerator including the subject matter of examples 1-10, including or omitting elements, wherein the cross correlation update unit further comprises a cross correlation memory integrated within and configured to store the determined cross correlation data.

Example 12 is a hardware accelerator including the subject matter of examples 1-11, including or omitting elements, wherein the iteration signal indicates a conclusion, when the convergence parameter satisfies a predetermined condition.

Example 13 is a hardware accelerator including the subject matter of examples 1-12, including or omitting elements, wherein the hardware accelerator is implemented as an application specific integrated circuit (ASIC).

Example 14 is an adaptation hardware accelerator comprising: a calculation unit configured to receive a plurality of inputs at one or more predefined time intervals, wherein each time interval corresponds to a calculation iteration, the plurality of inputs being associated with a plurality of adaptive filters each having a plurality of taps, and determine a correlation data and a cross-correlation data based thereon for a given calculation iteration, wherein the correlation data comprises a correlation matrix comprising a plurality of sub-matrices, wherein determining the correlation matrix comprises determining only the submatrices in an upper triangular portion and a diagonal portion of the correlation matrix; a DCD core unit configured to determine a plurality of adaptive weights associated with the plurality of adaptive filters, respectively, in the given calculation iteration based on the correlation data and the cross correlation data, wherein determining the plurality of adaptive weights comprises defining a residual vector comprising the correlation data and determining the plurality of adaptive weights based on the defined residual vector; a convergence detector unit configured to determine a convergence parameter; and a controller configured to generate an iteration signal for each of the predefined time intervals based on the convergence parameter, wherein the iteration signal communicates to the calculation unit and the DCD core unit to continue with a next calculation iteration or to conclude, wherein the conclusion indicates a determination of a final value of the plurality of the adaptive weights by the DCD core unit; and wherein the defined residual vector is updated in the next calculation iteration together with determining the cross correlation data in the correlation unit, only when the iteration signal indicates the next calculation iteration.

Example 15 is a hardware accelerator including the subject matter of example 14, wherein determining the sub-matrices in the upper triangular portion of the correlation matrix comprises determining only a first row and a first column in each of the sub-matrices in the upper triangular portion.

Example 16 is a hardware accelerator including the subject matter of examples 14-15, including or omitting elements, wherein determining the sub-matrices in the diagonal portion of the correlation matrix comprises determining a first row or a first column in each of the sub-matrices in the diagonal portion.

Example 17 is a hardware accelerator including the subject matter of examples 14-16, including or omitting elements, wherein the DCD core unit comprises: a maximum detector unit configured to determine a maximum residual vector and an index value based on the defined residual vector; a DCD calculation unit configured to perform a comparison based on the residual index vector to determine a final value of step size; and a weight calculation unit configured to determine the plurality of adaptive weights based on the residual index vector and the step size.

Example 18 is a method for a hardware accelerator, comprising: receiving a plurality of inputs at one or more predefined time intervals, wherein each time interval corresponds to a calculation iteration, the plurality of inputs being associated with a plurality of adaptive filters each having a plurality of taps, and determining a correlation data and a cross-correlation data based thereon in a given calculation iteration at a calculation unit; determining a plurality of adaptive weights associated with the plurality of adaptive filters, respectively, based on the correlation data and the cross correlation data at a DCD core unit, by defining a residual vector comprising the cross-correlation data; determining a convergence parameter at a convergence detector unit; generating an iteration signal based on the convergence parameter at a controller, wherein the iteration signal communicates to the calculation unit and the DCD core unit to continue with a next calculation iteration or to conclude; and updating the residual vector in the next iteration together with determining the cross correlation data in the calculation unit only when the iteration signal indicates the next iteration.

Example 19 is a method for a hardware accelerator including the subject matter of example 18, wherein determining the correlation data comprises determining a correlation matrix comprising a plurality of sub-matrices by determining only the submatrices in an upper triangular portion and a diagonal portion of the correlation matrix.

Example 20 is a method for a hardware accelerator including the subject matter of examples 18-19, including or omitting elements, wherein determining the sub-matrices in the upper triangular portion comprises determining only a first row and a first column in each of the sub-matrices in the upper triangular portion.

Example 21 is a method for a hardware accelerator including the subject matter of examples 18-20, including or omitting elements, wherein determining the sub-matrices in the diagonal portion comprises determining a first row or a first column in each of the sub-matrices in the diagonal portion.

Example 22 is a method for a hardware accelerator including the subject matter of examples 18-21, including or omitting elements, wherein determining the plurality of adaptive weights further comprises determining a maximum residual vector based on the defined residual vector, performing a comparison based on the residual index vector to determine a final value of step size and determining the plurality of adaptive weights based on the residual index vector and the step size.

Example 23 is a method for a hardware accelerator including the subject matter of examples 18-22, including or omitting elements, further comprising determining the correlation data and the cross correlation data in parallel, and determining the maximum residual vector based on the cross correlation data before the determination of the correlation data is completed.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

The invention claimed is:

1. An adaptation hardware accelerator, comprising:
a calculation unit configured to receive a plurality of inputs at one or more predefined time intervals, wherein each time interval corresponds to a calculation iteration, the plurality of inputs being associated with a plurality of adaptive filters each having a plurality of taps, and determine a correlation data and a cross-correlation data based thereon for a given calculation iteration, wherein the correlation data comprises a correlation matrix comprising a plurality of sub-matrices, wherein determining the correlation matrix comprises determining only the sub-matrices in an upper triangular portion and a diagonal portion of the correlation matrix;
an adaptation core unit configured to determine a plurality of adaptive weights associated with the plurality of adaptive filters, respectively, in the given calculation iteration based on the correlation data and the cross correlation data;
a convergence detector unit configured to determine a convergence parameter;
a controller configured to generate an iteration signal for each of the predefined time intervals based on the convergence parameter, wherein the iteration signal communicates to the calculation unit and the adaptation core unit to continue with a next calculation iteration or to conclude, wherein the conclusion indicates a determination of a final value of the plurality of the adaptive weights by the adaptation core unit; and
a processor configured to implement instructions associated with one or more of the calculation unit, the adaptation core unit, the convergence detector unit, or the controller.

2. The hardware accelerator of claim 1, wherein determining the sub-matrices in the upper triangular portion of the correlation matrix comprises determining only a first row and a first column in each of the sub-matrices in the upper triangular portion.

3. The hardware accelerator of claim 1, wherein determining the sub-matrices in the diagonal portion of the correlation matrix comprises determining a first row or a first column in each of the sub-matrices in the diagonal portion.

4. The hardware accelerator of claim 1, wherein the correlation matrix is a K*K matrix, wherein K corresponds to the number of inputs of the calculation unit.

5. The hardware accelerator of claim 1, wherein each of the plurality of sub-matrices is a K*N matrix, wherein K corresponds to the number of inputs of the calculation unit and N corresponds to the number of taps of the adaptive filters.

6. The hardware accelerator of claim 1, wherein the adaptation core unit is configured to determine the plurality of adaptive weights based on an optimized adaptive recursive least squares (RLS) based algorithm.

7. The hardware accelerator of claim 6, wherein the RLS based algorithm comprises a dichotomous coordinated descent (DCD) algorithm and determining the plurality of adaptive weights comprises defining a residual vector comprising the correlation data and determining the plurality of adaptive weights based on the defined residual vector, wherein the defined residual vector is updated in the next calculation iteration together with determining the cross correlation data in the calculation unit, only when the iteration signal indicates the next calculation iteration.

8. The hardware accelerator of claim 1, further comprising a scheduler configured to schedule operations of the calculation unit and the adaptation core unit.

9. The hardware accelerator of claim 1, wherein the calculation unit comprises:
an input memory unit configured to store the plurality of inputs;
a correlation update unit configured to determine the correlation data based on the inputs stored in the input memory unit; and
a cross-correlation update unit configured to determine the cross correlation data based on the inputs stored in the input memory unit.

10. The hardware accelerator of claim 9, wherein the correlation update unit further comprises a correlation memory integrated within and configured to store the determined correlation data.

11. The hardware accelerator of claim 9, wherein the cross correlation update unit further comprises a cross correlation memory integrated within and configured to store the determined cross correlation data.

12. The hardware accelerator of claim 1, wherein the iteration signal indicates a conclusion, when the convergence parameter satisfies a predetermined condition.

13. The hardware accelerator of claim 1, wherein the hardware accelerator is implemented as an application specific integrated circuit (ASIC).

14. An adaptation hardware accelerator, comprising:
a calculation unit configured to receive a plurality of inputs at one or more predefined time intervals, wherein each time interval corresponds to a calculation iteration, the plurality of inputs being associated with a plurality of adaptive filters each having a plurality of taps, and determine a correlation data and a cross-correlation data based thereon for a given calculation iteration, wherein the correlation data comprises a correlation matrix comprising a plurality of sub-matrices, wherein determining the correlation matrix comprises determining only the sub-matrices in an upper triangular portion and a diagonal portion of the correlation matrix;
a DCD core unit configured to determine a plurality of adaptive weights associated with the plurality of adaptive filters, respectively, in the given calculation iteration based on the correlation data and the cross correlation data, wherein determining the plurality of adaptive weights comprises defining a residual vector comprising the correlation data and determining the plurality of adaptive weights based on the defined residual vector;
a convergence detector unit configured to determine a convergence parameter;

a controller configured to generate an iteration signal for each of the predefined time intervals based on the convergence parameter, wherein the iteration signal communicates to the calculation unit and the DCD core unit to continue with a next calculation iteration or to conclude, wherein the conclusion indicates a determination of a final value of the plurality of the adaptive weights by the DCD core unit; and a processor configured to implement instructions associated with one or more of the calculation unit, the DCD core unit, the convergence detector unit, or the controller; and wherein the defined residual vector is updated in the next calculation iteration together with determining the cross correlation data in the calculation unit, only when the iteration signal indicates the next calculation iteration.

15. The hardware accelerator of claim 14, wherein determining the sub-matrices in the upper triangular portion of the correlation matrix comprises determining only a first row and a first column in each of the sub-matrices in the upper triangular portion.

16. The hardware accelerator of claim 14, wherein determining the sub-matrices in the diagonal portion of the correlation matrix comprises determining a first row or a first column in each of the sub-matrices in the diagonal portion.

17. The hardware accelerator of claim 14, wherein the DCD core unit comprises:
   a maximum detector unit configured to determine a maximum residual vector and an index value based on the defined residual vector;
   a DCD calculation unit configured to perform a comparison based on the residual vector to determine a final value of step size; and
   a weight calculation unit configured to determine the plurality of adaptive weights based on the residual index vector and the step size.

18. A method for a hardware accelerator, comprising:
   receiving a plurality of inputs at one or more predefined time intervals, wherein each time interval corresponds to a calculation iteration, the plurality of inputs being associated with a plurality of adaptive filters each having a plurality of taps, and determining a correlation data and a cross-correlation data based thereon in a given calculation iteration at a calculation unit;

determining a plurality of adaptive weights associated with the plurality of adaptive filters, respectively, based on the correlation data and the cross correlation data at a DCD core unit, by defining a residual vector comprising the cross-correlation data;
   determining a convergence parameter at a convergence detector unit;
   generating an iteration signal based on the convergence parameter at a controller, wherein the iteration signal communicates to the calculation unit and the DCD core unit to continue with a next calculation iteration or to conclude; and
   updating the residual vector in the next iteration together with determining the cross correlation data in the calculation unit only when the iteration signal indicates the next iteration,
   wherein one or more of the receiving the plurality of inputs, the determining the plurality of adaptive weights, the determining the convergence parameter, the generating the iteration signal, or the updating the residual vector are implemented via a processor.

19. The method of claim 18, wherein determining the correlation data comprises determining a correlation matrix comprising a plurality of sub-matrices by determining only the sub-matrices in an upper triangular portion and a diagonal portion of the correlation matrix.

20. The method of claim 19, wherein determining the sub-matrices in the upper triangular portion comprises determining only a first row and a first column in each of the sub-matrices in the upper triangular portion.

21. The method of claim 19, wherein determining the sub-matrices in the diagonal portion comprises determining a first row or a first column in each of the sub-matrices in the diagonal portion.

22. The method of claim 18, wherein determining the plurality of adaptive weights further comprises determining a maximum residual vector based on the defined residual vector, performing a comparison based on the residual vector to determine a final value of step size and determining the plurality of adaptive weights based on the residual vector and the step size.

23. The method of claim 22, further comprising determining the correlation data and the cross correlation data in parallel, and determining the maximum residual vector based on the cross correlation data before the determination of the correlation data is completed.

* * * * *